United States Patent [19]
Yamaoka et al.

[11] Patent Number: 6,077,720
[45] Date of Patent: Jun. 20, 2000

[54] METHOD FOR FABRICATING SEMICONDUCTOR LASER FACETS USING COMBINED CLEAVE AND POLISH TECHNIQUE

[75] Inventors: Yoshifumi Yamaoka, Kawasaki; Satoshi Watanabe, Kanagawa; Norihide Yamada, Kokubunji, all of Japan; Eric Marenger, Montreal, Canada

[73] Assignee: Agilent Technologies, Palo Alto, Calif.

[21] Appl. No.: 09/213,124

[22] Filed: Dec. 15, 1998

[30] Foreign Application Priority Data

Dec. 27, 1997 [JP] Japan .................................. 9-367832

[51] Int. Cl.⁷ .......................... H01L 21/00; H01L 21/46
[52] U.S. Cl. ........................ 438/33; 438/462; 438/464; 438/959
[58] Field of Search ........................... 438/22, 33, 110, 438/113, 460, 462, 464, 959

[56] References Cited

U.S. PATENT DOCUMENTS

| | | | |
|---|---|---|---|
| 4,236,296 | 12/1980 | Woolhouse et al. | 438/33 |
| 4,237,601 | 12/1980 | Woolhouse et al. | 438/33 |
| 4,442,178 | 4/1984 | Kimura et al. | 428/446 |
| 5,629,233 | 5/1997 | Chand et al. | 438/33 |

FOREIGN PATENT DOCUMENTS

| | | |
|---|---|---|
| 54-95674 | 7/1979 | Japan . |
| 55-88303 | 2/1980 | Japan . |
| 59-68027 | 4/1984 | Japan . |
| 64-110965 | 4/1989 | Japan . |
| 4-143555 | 5/1992 | Japan . |
| 4-172042 | 6/1992 | Japan . |
| 5-92403 | 7/1994 | Japan . |
| 7-287875 | 4/1997 | Japan . |
| 7-347691 | 6/1997 | Japan . |
| 8-207719 | 6/1998 | Japan . |

OTHER PUBLICATIONS

Kazuhiko Itaya et al., "Room Termperature Pulsed Operation of Nitride Based Multi–Quantum–Well Laser Diodes with Cleaved Facets on Conventional C–Face Sapphire Substrates", Japan Journal of Applied Physics, vol. 35, pp. L1315–1317, part 2, No. 10B, Oct. 15, 1996.

*Primary Examiner*—Charles Bowers
*Assistant Examiner*—Keith Christianson

[57] ABSTRACT

A method for fabricating opto-electronic devices having a surface that includes a first mirror facet in a first semiconductor layer deposited on a wafer. The mirror facet is located in a first facet plane. In the method of the present invention, the wafer is divided along a first line to create a segment having the mirror facet located therein. The segment is fixed to a fixture that moves in relation to a dicing disk that has a first planar surface in which polishing grit is embedded. The segment is fixed to a mounting surface such that the first plane is aligned parallel to the first planar surface of the dicing disk. The dicing disk is caused to rotate while the first planar surface is in contact with the segment, but not in contact with the mounting surface, thereby polishing a surface of the segment. For opto-electronic devices that include a second mirror facet in a second facet plane, the second facet plane being parallel to the first facet plane and displaced therefrom, the wafer is also divided along the second line such that the segment also includes the second facet plane. The second mirror surface is polished by causing the dicing disk to rotate while the second planar surface is in contact with the segment along the second line. The present invention can be practiced with a conventional dicing saw.

9 Claims, 3 Drawing Sheets

METHOD FOR FABRICATING SEMICONDUCTOR LASER FACETS USING COMBINED CLEAVE AND POLISH TECHNIQUE

FIELD OF THE INVENTION

The present invention relates to the fabrication of opto-electronic devices, and more particularly, to a method for providing smooth facets on the devices.

BACKGROUND OF THE INVENTION

Laser diodes (LDs) based on GaN and other Group III-V semiconductors are of great interest because such laser diodes operate in the blue region of the optical spectrum. An edge-emitting GaN LD is typically fabricated by depositing a number of layers of GaN-based semiconductors on a sapphire substrate. The mirrors that form the ends of the laser cavity are created by cleaving the sapphire substrate and GaN layers. Ideally, the cleavage occurs along the crystal planes of the GaN layers leaving smooth facets that are perpendicular to the direction of light propagation in the laser.

In practice, the cleaving is accomplished by cutting the back side of the wafer (i.e., the side opposite to that on which the GaN layers are deposited) with a dicing saw or a scribe to form a groove having a V-shaped cross-section in the sapphire. The depth of the groove is determined by the device used to cut the groove. If a scribe is utilized, the groove is very shallow. If a dicing saw is utilized, the groove may extend a significant distance into the sapphire substrate. The cleaving is performed by applying pressure from the front or back surface of the wafer. Prior art systems that cleave in this manner are described in Unexamined Japanese Patent Publication No. H5-343742 and Unexamined Japanese Patent Publication No. H5-315643.

Unfortunately, sapphire does not cleave easily. As a result, the resulting cleaved face is often rough, and hence, poorly suited for the mirrors that define the ends of the laser cavity.

In addition, the crystal planes of the semiconductor layers are usually not aligned with the crystal planes of the sapphire, so that cleaving the wafer may result in the semiconductor layers having a facet having one or more of the following defects: misalignment with the facet of the sapphire substrate, inadequate flatness, and an undesired orientation.

To overcome these problems, additional processing is often required. For example, the facets are polished in some fabrication systems. In these systems, the cleaved part is mounted on a polishing device and polished with diamond slurry. This method requires that the device be mounted twice in the polishing apparatus, once to polish each of the two mirrors. As a result, polishing contributes substantially to the cost of the devices, and is to be avoided.

Methods based on dry etching of the cleaved device utilizing reactive ion etching (RIE) or reactive ion beam etching (RIBE) have been utilized to smooth the facets without resorting to mechanical polishing. However, these techniques have a number of problems. First, the etch times are significant. Second, etching conditions that provide a smooth surface are not easily obtained. Accordingly, dry etching has not provided the needed solution to the problem of providing mirror quality facets at a cost that does not significantly increase the cost of the final device.

Broadly, it is the object of the present invention to provide an improved method for providing polished facets in Group III-V semiconductor devices.

It is a further object of the present invention to provide a cutting and polishing method capable of obtaining a sufficiently smooth surface without using conventional polishing techniques.

It is a still further object of the present invention to provide a method for fabricating opto-electronic devices that polishes both cut end surfaces of the source material of the opto-electronic device without removing the source material of the opto-electronic device from the polishing fixture.

These and other objects of the present invention will become apparent to those skilled in the art from the following detailed description of the invention and the accompanying drawings.

SUMMARY OF THE INVENTION

The present invention is a method for fabricating opto-electronic devices having a surface that includes a first mirror facet in a first semiconductor layer deposited on a wafer. The mirror facet is located in a first facet plane. In the method of the present invention, the wafer is divided along a first line to create a segment having the mirror facet located therein. The segment is fixed to a fixture that moves in relation to a dicing disk that has a first planar surface in which polishing grit is embedded. The segment is fixed to a mounting surface such that the first plane is aligned parallel to the first planar surface of the dicing disk. The dicing disk is caused to rotate while the first planar surface is in contact with the segment, but not in contact with the mounting surface, thereby polishing a surface of the segment. For opto-electronic devices that include a second mirror facet in a second facet plane, the second facet plane being parallel to the first facet plane and displaced therefrom, the wafer is also divided along the second line such that the segment also includes the second facet plane. The second mirror surface is polished by causing the dicing disk to rotate while the second planar surface is in contact with segment along the second line. The present invention can be practiced with a conventional dicing saw.

DETAILED DESCRIPTION OF THE INVENTION

For the purposes of the present discussion, it will be assumed that the opto-electronic device has been constructed on a wafer which is then cut to provide a device in which two opposing ends correspond to the facets that must be polished. As will be explained in detail below, the cut device or devices are mounted on a fixture that moves relative to a dicing disk that polishes the facets. The devices do not need to be remounted when the second facet is polished; hence, the present invention substantially reduces the cost of polishing the devices. In addition, the dicing disk has the polishing grid embedded therein which further reduces the processing costs relative to polishing methods that utilize a polishing slurry.

Figure 1:
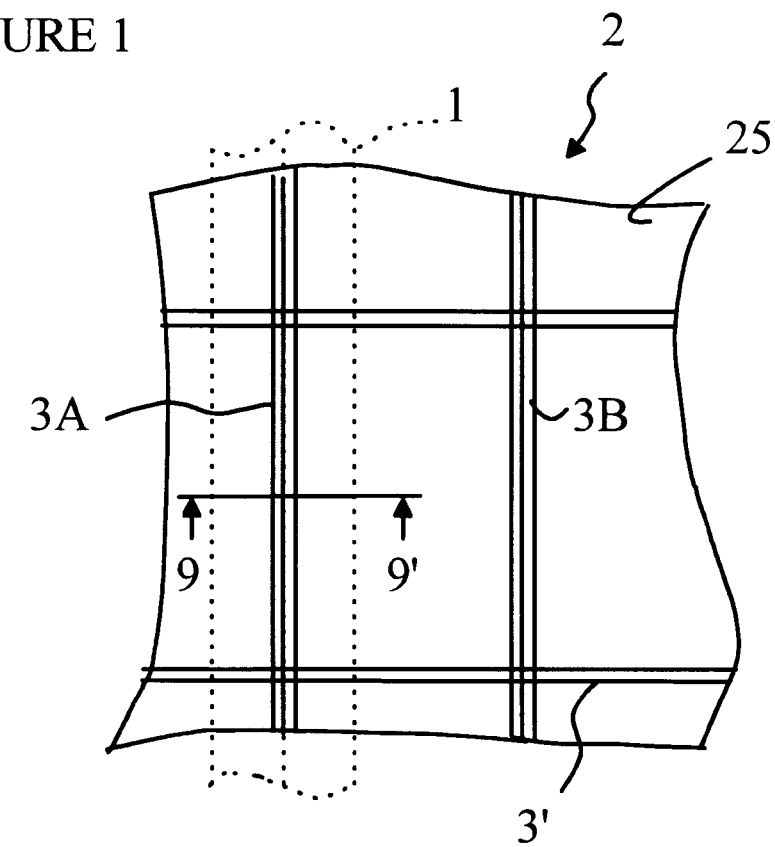
FIG. 1 is a bottom view of a wafer 2 on which the opto-electronic devices have been partially fabricated.
Figure 2:
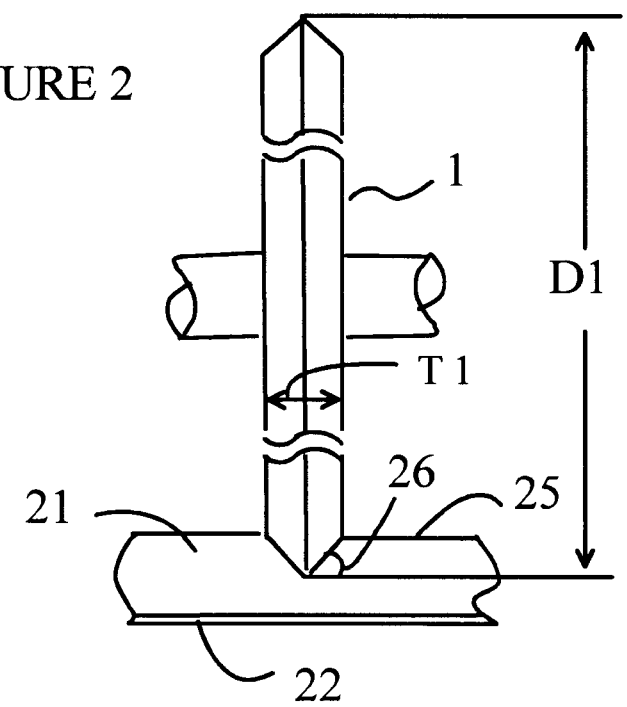
FIG. 2 is a cross-sectional view of the wafer shown in FIG. 1 through line 9—9'.

Refer now to FIGS. 1 and 2, which illustrate the manner in which the opto-electronic devices are cut from the wafer. FIG. 1 is a bottom view of a wafer 2 on which the opto-electronic devices have been partially fabricated. FIG. 2 is a cross-sectional view through line 9—9'. In the preferred embodiment of the present invention, the wafer is partially cut on the backside 25 of the wafer utilizing a dicing saw to create two V-shaped grooves. The dicing saw blade 1 moves with respect to the wafer 2 creating grooves in the back of the wafer. The grooves are positioned with respect to the facets to be polished. Exemplary grooves are shown at 3A and 3B. In the preferred embodiment of the present invention, a blade with a diameter D1 of 52 mm, thickness TI of 0.2 mm, blade tip angle 26 of 60° is used as the dicing blade 1. A blade suitable for use in the present invention is commercially available under the trade name DIAMOND BLADE from Disco, Japan (Pattern no. B1E803, or NBC-Z 202JLT1, 52×0.2×40×60°).

The wafer is further divided into segments that are to be mounted and polished together. Each segment may be an individual opto-electronic device or a row of such devices with their mirror facets aligned with V-shaped grooves. The segments are cut from the wafer with the aid of a conventional dicing blade. The separation cuts are shown at 3' in FIG. 1.

As shown in FIG. 2, the wafer includes a number of GaN-based semiconductor layers shown on the front surface of the sapphire substrate 21 at 22. The semiconductor layers may be layers of a group of III-V semiconductor material, preferably of a group of III-N semiconductor material such as GaN, AlN, InN, BN, AlInN, GaInN, AlGaN, BAlN, BInN, BGaN and BAlGaN, or more preferably of a GaN-based semiconductor material. For the purposes of the present discussion, it will be assumed that these layers are used to implement one or more laser diodes whose mirror facets are aligned with grooves 3A and 3B. The sapphire substrate typically has a thickness of 100 to 500 $\mu$m and the c axis defines the facet orientation. The depth of V-grooves 3A and 3B, as measured from the back surface 25 of the wafer is about 50 $\mu$m. V-groove 3 is typically formed using the above-described dicing blade operating at 30,000 rpm. The devices are separated from the wafer by cleaving along the V-grooves.

Figure 3:
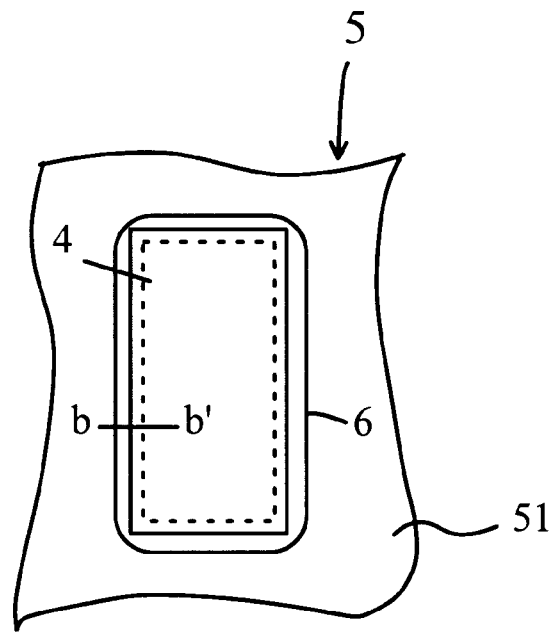
FIG. 3 is a top view illustrating a segment having one or more opto-electronic devices affixed to a fixture according to the present invention.
Figure 4:
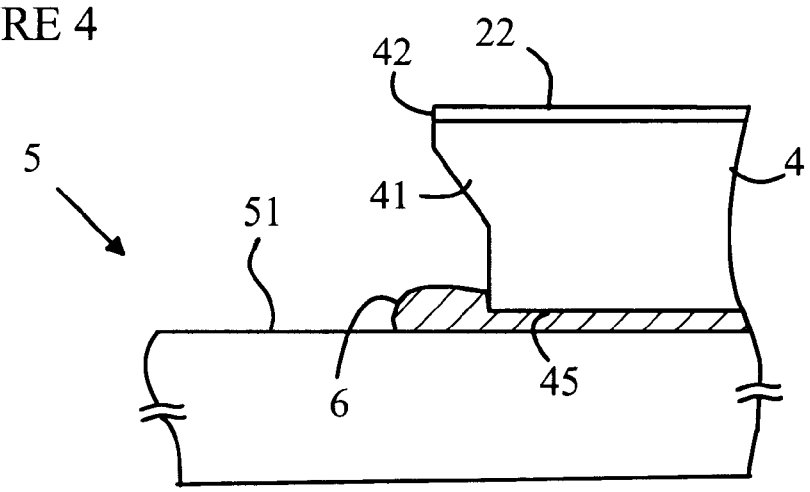
FIG. 4 is a cross-sectional view of the segment shown in FIG. 3 through line b—b'.

Refer now to FIGS. 3 and 4 which illustrate the manner in which the diced parts are fixed prior to polishing. FIG. 3 is a top view illustrating a segment 4 having one or more opto-electronic devices affixed to a fixture 5 having a glass plate with a mounting surface 51. FIG. 4 is a cross-sectional view along the b–b' line in FIG. 3. The back surface 45 of the source material for the opto-electronic device 4 is fixed by a wax layer 6 to mounting surface 51. The cleavage of the segment along the V-groove creates an overhang 41 that includes the surface 42 to be polished.

Figure 5:
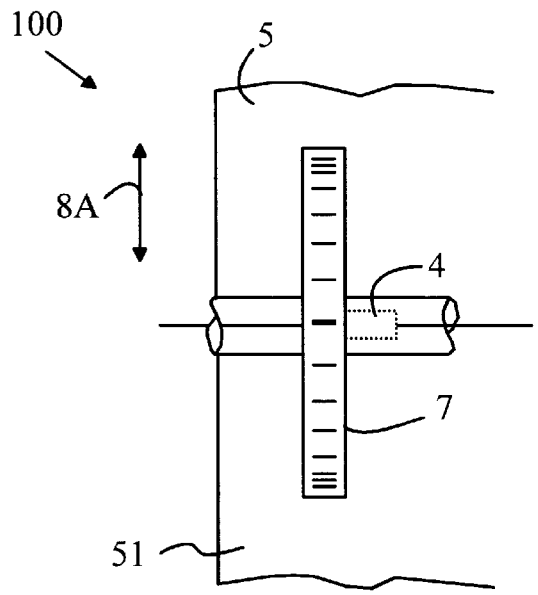
FIG. 5 is a top view of a dicing disk and wafer segment during the polishing process of the present invention.
Figure 6:
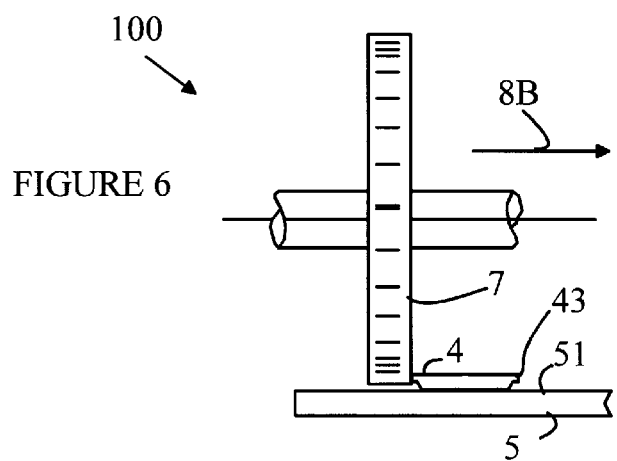
FIG. 6 is a side view of the dicing disk and segment shown in FIG. 5.

The mounted segment is then cut and polished by utilizing a dicing disk 7 as shown in FIGS. 5 and 6. FIG. 5 is a top view of dicing disk 7 and segment 4 during the polishing process, and FIG. 6 is a side view of dicing disk 7 and segment 4 during the polishing process. Dicing disk 7 makes one or more passes in contact with the surface of segment 4 that is to be polished. Dicing disk 7 is moved in the direction shown by arrow 8A during each pass. If multiple passes are utilized, the dicing disk is moved in the direction shown by arrow 8B between each pass so as to remove more material. The process is terminated when a planar facet of the desired smoothness is obtained. The stepping distance for each path is typically 0.1 $\mu$m.

After the first set of facets has been polished, the facets on the opposite end 43 of the segment can be cut and polished by moving the position of dicing disk 7. If both surfaces of dicing disk 7 have polishing grit, the mounting fixture does not need to be removed from the mechanical platform used for moving dicing disk 7 relative to segment 4.

A dicing blade of the type used to cut wafers is suitable for dicing disk 7. A blade suitable for this purpose is sold commercially by Disco, Japan, under the name DIAMOND BLADE (Pattern No. SD6000). The disk is used at a speed of typically 30,000 rpm. The dicing disk only needs to have diamond particles or powder embedded in that portion of the disk that comes in contact with the portion of the segment to be polished. It should also be noted that the diameter of the above dicing disk utilized in the present invention is significantly smaller than the diameter of the polishing disk used in prior art polishing methods. Hence, the quantity of diamond powder needed is significantly reduced with the present invention.

Figure 7:
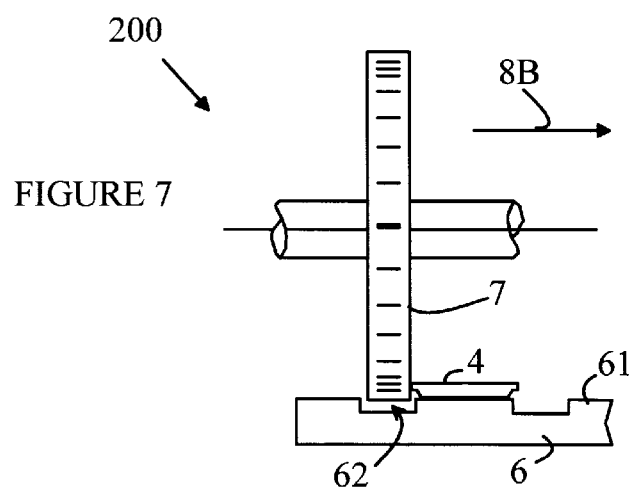
FIG. 7 is a side view of another embodiment of a polishing fixture for use with the method of the present invention.

Furthermore, different regions of the dicing disk may be utilized once one region is worn by changing the distance between the center of the axis on which the disk rotates and the mounting surface. The areas of the dicing disk that are available for use may be further increased by providing a recess in the mounting fixture as shown in FIG. 7 which is a side view of another embodiment of a polishing apparatus 200 according to the present invention. Polishing apparatus 200 differs from polishing apparatus 100 shown in FIGS. 5 and 6 in that the mounting fixture 6 includes a cut-out 62 which allows dicing disk 7 to move below the surface 61 on which the opto-electronic device is mounted.

This embodiment of the present invention is also well suited for processing segments in which the parts are cleaved via a scribe. When cleaved, the resulting segments do not have the large overhang generated by cleavage along a saw-cut V-groove. Accordingly, the clearance between the mounting surface and the end of the dicing disk is much less. The additional cutout assures that the dicing disk does not come in contact with the mounting surface.

It should also be noted, the present invention may be practiced on the same mechanical system used to dice the wafers. The fixture of the present invention is merely inserted in the device in place of the wafer and the dicing disk is utilized in place of the dicing saw that is used to cut the V-shaped grooves. Hence, the present invention does not require additional, and expensive, precision carriages to provide the movement of the dicing disk with respect to the mounted segment.

The polishing operation is repeated on the surface of the strip created by cleavage along V-shaped groove 3B in devices having opposing mirrors. It should be noted that the mounting fixture only needs to be moved relative to the dicing disk to properly position the dicing disk for these mirrors. Accordingly, the segment does not need to be remounted on the fixture.

Various modifications to the present invention will become apparent to those skilled in the art from the foregoing description and accompanying drawings.

Accordingly, the present invention is to be limited solely by the scope of the following claims.

What is claimed is:

1. A method for fabricating opto-electronic devices having a front surface comprising a first mirror facet in a first semiconductor layer deposited on a wafer, said mirror facet being located in a first facet plane, said method comprising the steps of:

dividing said wafer along a first line to create a segment having said mirror facet located therein;

fixing said segment to a fixture that moves in relation to a dicing disk, said dicing disk comprising a first planar surface having a polishing grit embedded therein, wherein said segment is fixed such that said first plane is aligned parallel to said plane of said dicing disk, said fixture including a mounting surface to which said segment is affixed; and causing said dicing disk to rotate while said first planar surface is in contact with said segment, but not in contact with said mounting surface, thereby polishing a surface of said segment.

2. The method of claim 1 wherein said dicing disk moves relative to said segment along a first direction that is parallel to said first facet plane, and wherein said dicing disk moves along said first direction while polishing said surface of said segment.

3. The method of claim 1 wherein said opto-electronic device comprises a second mirror facet in a second facet plane, said second facet plane being parallel to said first facet plane and displaced therefrom, and wherein said step of dividing said wafer to create said segment comprises dividing said wafer along a second line such that said segment also comprises said second facet plane.

4. The method of claim 3 wherein said dicing disk further comprises a second planar surface parallel to said first planar surface, said second planar surface also having polishing grit embedded therein, and wherein said method further comprises the step of causing said dicing disk to rotate while said second planar surface is in contact with said segment along said second line.

5. The method of claim 1 wherein said step of dividing said wafer comprises cutting V-shaped grooves in said wafer utilizing a dicing saw.

6. The method of claim 1 wherein said segment comprises a plurality of opto-electronic devices, each of said opto-electronic devices comprising a mirror facet located in said first plane.

7. The method of claim 1 wherein said mounting surface comprises a recessed area for allowing said dicing disc to extend below said segment without contacting said fixture.

8. The method of claim 1 wherein said first semiconductor layer comprises a group III-V semiconductor material.

9. The method of claim 8 wherein said first semiconductor layer comprises a Group III-nitride semiconductor material.

* * * * *